United States Patent [19]
Carlson et al.

[11] Patent Number: 5,245,286
[45] Date of Patent: Sep. 14, 1993

[54] APPARATUS AND METHOD FOR STABILIZING THE BACKGROUND MAGNETIC FIELD DURING MRI

[75] Inventors: Joseph W. Carlson, Kensington; David M. Goldhaber, Berkeley, both of Calif.

[73] Assignee: The Regents of the University of California, Oakland, Calif.

[21] Appl. No.: 702,428

[22] Filed: May 20, 1991

Related U.S. Application Data

[63] Continuation-in-part of Ser. No. 688,131, Apr. 19, 1991, abandoned, which is a continuation-in-part of Ser. No. 686,622, Apr. 18, 1991, abandoned.

[51] Int. Cl.$^5$ .......................................... G01R 33/20
[52] U.S. Cl. .................................................. 324/319
[58] Field of Search ............... 324/303, 307, 309, 311, 324/312, 313, 314, 315, 318, 322

[56] References Cited

U.S. PATENT DOCUMENTS

| | | | |
|---|---|---|---|
| 3,568,046 | 3/1971 | Watson | 324/310 |
| 3,921,060 | 11/1975 | Ekimovskikh et al. | 324/315 |
| 4,389,613 | 6/1983 | Brown | 324/303 |
| 4,480,227 | 10/1984 | Brown | 324/303 |
| 4,885,542 | 12/1989 | Yao et al. | 324/313 |
| 4,910,460 | 3/1990 | Sebok | 324/307 |
| 4,970,457 | 11/1990 | Kaufman et al. | 324/309 |
| 4,975,644 | 12/1990 | Fox | 324/318 |

OTHER PUBLICATIONS

Pohjonen, et al, "Compensation of Magnetic Field Instabilities in MRI", SMRM Eighth Annual Meeting (Amsterdam 1989) p. 968.

*Primary Examiner*—Michael J. Tokar
*Attorney, Agent, or Firm*—Nixon & Vanderhye

[57] ABSTRACT

A pair of serially-connected coils detect noise variations in an MRI background magnetic field. Although the coils are closely coupled to the primary background magnetic field generator of the MRI system, they are disposed so as to be substantially de-coupled from rapidly changing MRI gradient magnetic fields. The noise detecting loops drive a negative feedback loop including a low pass filter, amplifier and controlled current source driving a large correcting loop. The device attenuates background magnetic field noise during MRI data acquisition over a frequency band extending from a few millihertz to more than 100 Hz. It is preferably used with existing field stabilization software that otherwise compensates for fluctuations in an overlapping frequency band which starts at d.c. Thus, when used together, background magnetic field noise may be attenuated (or compensated for in subsequent MRI data processing) over a frequency band that extends from d.c. to more than 100 Hz.

31 Claims, 2 Drawing Sheets

APPARATUS AND METHOD FOR STABILIZING THE BACKGROUND MAGNETIC FIELD DURING MRI

This is a continuation-in-part of our earlier U.S. patent application Ser. No. 07/688,131, filed Apr. 19, 1991 (now abandoned), which is, in turn, a continuation-in-part of our yet-earlier U.S. patent application Ser. No. 07/686,622, filed Apr. 18, 1991 now abandoned).

This invention is generally related to Magnetic Resonance Imaging (MRI) using Nuclear Magnetic Resonance (NMR) phenomena. It more specifically relates to method and apparatus for effectively stabilizing the background magnetic field during MRI.

During MRI, noise fluctuations in the ambient background magnetic field are superimposed on the field of the primary MRI system background field generator. Such magnetic noise degrades the quality of images by creating ghost and bleed artifacts. Methods exist for sampling the magnetic field one (or more) time(s) per MRI cycle repetition time interval TR and for then correcting the acquired image in programmed data processing during construction. See, for example, the field stabilization techniques described more fully in commonly assigned and related U.S. Pat. No. 4,885,542 and U.S. Pat. No. 4,970,457 to Kaufman et al. The entire contents of both these related U.S. patents are hereby incorporated by reference. Such field stability processes are preferably used in combination with novel hardware described below to constitute part of this invention.

Such prior field stabilization compensation works best if the magnetic field is changing at a rate slow compared with TR and fails entirely if the changes are much faster than TR. The maximum usable value for TR may be limited by local magnetic field noise; if at a frequency f there exists noise which is sufficient to destroy an image, the time interval between samplings of the field cannot be made longer than ½f. Our invention mitigates this limitation.

Others have also proposed an MRI system having a background magnetic field noise detector driving a negative feedback background magnetic field compensating coil. See, for example:

Pohjonen, et al, "Compensation of Magnetic Field Instabilities in MRI", SMRM Eighth Annual Meeting (Amsterdam 1989) p. 968.

The Pohjonen et al technique uses a magnetometer which is installed extremely off-center (1.5 meters) from the magnet axis (presumably to minimize sensitivity to pulsed gradient fields). It also requires an auxiliary probe coil to offset the nominal Earth's magnetic field and the fringe field of the magnet at the probe position. The magnetometer and the negative feedback loop driven by it appear to respond to d.c. as well as noise fluctuations up to 20 Hz thereby making it sensitive to long term drifts in the background magnetic fields being sensed. Although Pohjonen et al only used one magnetometer probe, they suggest using two or more probes placed symmetrically on opposite sides of the magnet to better sense inhomogeneous noise sources and to reduce coupling to pulsed MRI magnetic gradient fields. The Pohjonen et al compensation coil is said to be wound around the magnet and is thus assumed to be of approximately the same size as the magnet itself.

We have now discovered a novel arrangement of field sensing detector, negative feedback loop and compensation loop which is superior in many respects to that of Pohjonen et al. Our invention is also advantageously combined with the known field stabilization compensation techniques noted above to provide a particularly novel and advantageous composite MRI system with field noise compensation over an extremely wide frequency band from d.c. to 100 Hz or more.

The invention includes (A) a device for attenuating relatively rapid a.c. changes in the ambient magnetic field and (B) the method of using this device in conjunction with known field stability software to effectively stabilize the magnetic field from d.c. to, e.g., more than 100 Hz.

The device in the exemplary embodiment includes:

(1) A pair of pickup loops, connected in series, oriented to sense changes in flux along the magnet axis. Each circular pickup loop is centered with respect to the magnet axis, minimizing the (undesired) signals from the pulsed transverse gradients. The two loops are symmetrically placed in the axial direction so that signals from the pulsed axial gradient are opposite in sign and equal in amplitude, thereby cancelling.

2. Amplifying and filtering electronics, followed by a high-transconductance current amplifier.

3. A correcting coil several times larger than the pickup loop and the magnet. This loop creates a field which opposes the undesired noise field. The large size ensures that the correcting field is spatially uniform; the magnetic flux density from the correcting loop is essentially identical through the imaging volume and through the pickup loops.

The device works by negative feedback. The pickup signal is proportional to the time derivative of the sum of the ambient field and the correcting field. The correcting field itself is proportional to this signal. This describes a device which is a low-pass filter for the ambient magnetic field, with a characteristic frequency which is inversely proportional to the open-loop magnetic field gain, $B(out)/(dB(in)/dt)$.

At least the following features and combinations thereof are believed to be novel:

(a) The detector coil pair disposed to directly sample the relevant field in the MRI volume within the magnet along its axis and yet decoupled from the pulsed MRI magnetic gradient fields $G_x$, $G_y$, $G_z$.

(b) The large correcting loop, creating a spatially uniform correcting field.

(c) The lack of gain at d.c. so that long-term drifts in the field created by the device are not a problem.

(d) The method of using the device in conjunction with field stability compensation software. The software attenuates image artifact effects caused by magnetic field noise at frequencies from d.c. to about $1/TR$. The hardware attenuates fluctuations above some frequency below $1/TR(max)$, where $TR(max)$ is the maximum value of TR. The hardware and software together work from d.c. to frequencies much higher than $1/TR$.

These as well as other objects and advantages of this invention will be more fully understood and appreciated by careful study of the following detailed description of a presently preferred exemplary embodiment and the accompanying drawings, of which:

Figure 1:
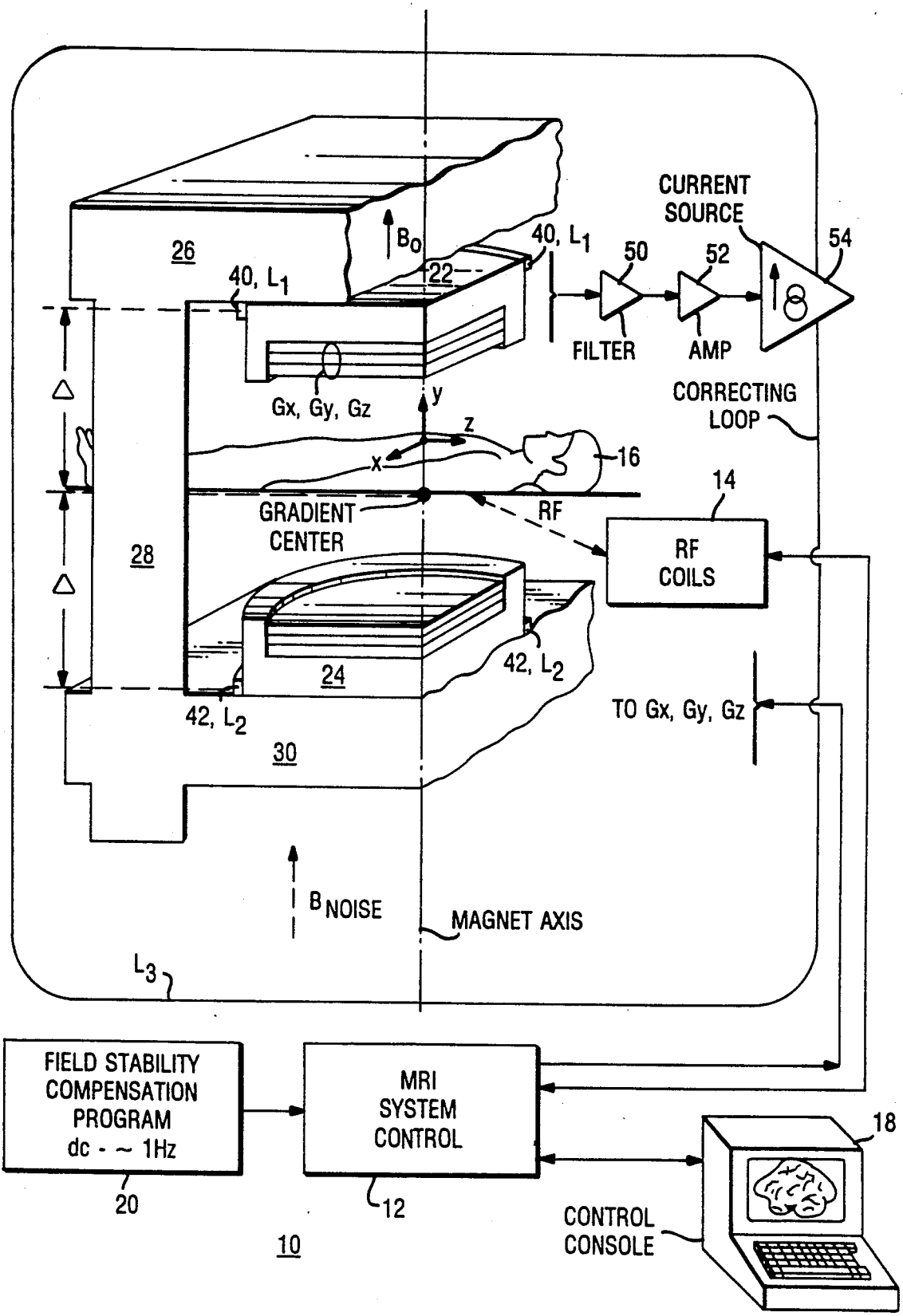
FIG. 1 is a schematic depiction of an exemplary MRI system incorporating field stability compensation software and illustrating novel pickup coil pair placement and compensating loop placement in an exemplary embodiment of this invention.

Referring to FIG. 1, an exemplary embodiment of this invention includes an MRI system 10 having the usual computerized MRI system control 12 for effecting MRI data gathering cycles by controllably generating NMR RF nutation pulses via RF coils 14 and pulsed orthogonal magnetic gradients (e.g., via gradient coils $G_x$, $G_y$, $G_z$) along the usual x,y,z coordinate axes within an imaged volume containing part of a living patient anatomy 16. The elicited NMR RF responses are received by RF coils 14 (in conjunction with the usual RF circuits), recorded and processed into images of spatial distribution of NMR nuclei within the imaged volume. Suitable 2DFT, 3DFT, projection reconstruction or the like data processing can be used in conjunction with spin-echo, gradient-echo or the like NMR sequences as will be apparent to those in the art. The MRI system typically interfaces to a human operator via a control console 18 as will also be apparent to those in the art.

In the exemplary embodiment, MRI system control 12 is also subject to field stability compensation programs (in program store 20) in accordance with the earlier referenced related patent applications incorporated by reference herein. As already noted, such compensation effectively attenuates image artifact caused by background magnetic noise in a very low frequency range from d.c. to about 1/TR Hz, where TR is the maximum MRI repetition interval TR.

The presently preferred embodiment is used in conjunction with the commercially available "low field" permanent magnet MRI system earlier sold by Diasonics Inc. and now by Toshiba Corporation. Here, upper and lower permanent magnets 22, 24 are part of a magnetic circuit including members 26, 28, 30 and produce a nominally constant homogeneous background magnetic field $B_o$ within the imaged volume containing relevant patient anatomy 16. In addition, pancake style flat magnetic gradient coils $G_x$, $G_y$, $G_z$ located within or adjacent each magnet 22, 24 can be controllably pulsed to create orthogonal gradients in the background $B_o$ field as may be desired to effect conventional MRI data gathering cycles.

Unfortunately, the actual background field $B_o$ within the image volume is not always constant over a complete MRI data gathering process (which may last up to several minutes). Large nearby moving masses of magnetically permeable material (e.g., elevators, trains, trucks) may cause relatively high frequency noise in the nominally constant background field. So may large nearby electrical current surges (e.g., as associated with large electrical trolley or train systems). Even the Earth's magnetic field itself may include noise components which cause artifacts in the resultant MR image.

While the lowest frequency components (e.g., d.c. up to 1/TR) of such magnetic noise may be compensated by known field stabilization programs in the MRI system, higher frequency components cannot. Thus, the exemplary embodiment of FIG. 1 combines the known field stabilization processes with novel negative feedback that tends to actually cancel higher frequency magnetic noise.

Here, a pair of sensing coils 40, 42 (also denoted $L_1$, $L_2$ in FIG. 1) are linked directly to the background magnetic flux actually passing through the patient imaging volume in the center of the magnet structure. Nevertheless, by judicious disposition, sensing coils 40, 42 are substantially decoupled (collectively—when electrically connected in series) from the pulsing gradient fields. For example, by centering the sensing coils about the magnet axis (and thus symmetrically with respect to the gradient coils in x,z dimensions), the effects of transverse gradient coils $G_x$, $G_z$ are minimized. By also disposing the sensing coils symmetrically in the axial dimension with respect to the gradient coil pairs (e.g., $+\Delta$ and $-\Delta$ to either side of the gradient center), coupling to the axially directed gradient $G_y$ is also suppressed.

Having thus succeeded in providing sensing of the desired magnetic background field in the image volume while suppressing unwanted coupling to the purposefully pulsed magnetic gradients, the negative feedback loop is completed by low pass filter 50, amplifier 52 and controlled current source 54 driving a relatively large compensating loop $L_3$. As explained above, the net effect of this is to actually suppress undesired background magnetic noise in the image volume over a frequency range which overlaps with that of the field stability software compensation and extends on upwardly to even 100 Hz or more.

The electrical amplifiers respond to a signal proportional to the time derivative of the magnetic field rather than the field itself. Thus, although the amplifier itself may have considerable gain at d.c., the circuit as a whole—including the noise detector and compensating coils—has no gain at d.c. insofar as the magnetic field is concerned.

Figure 2:
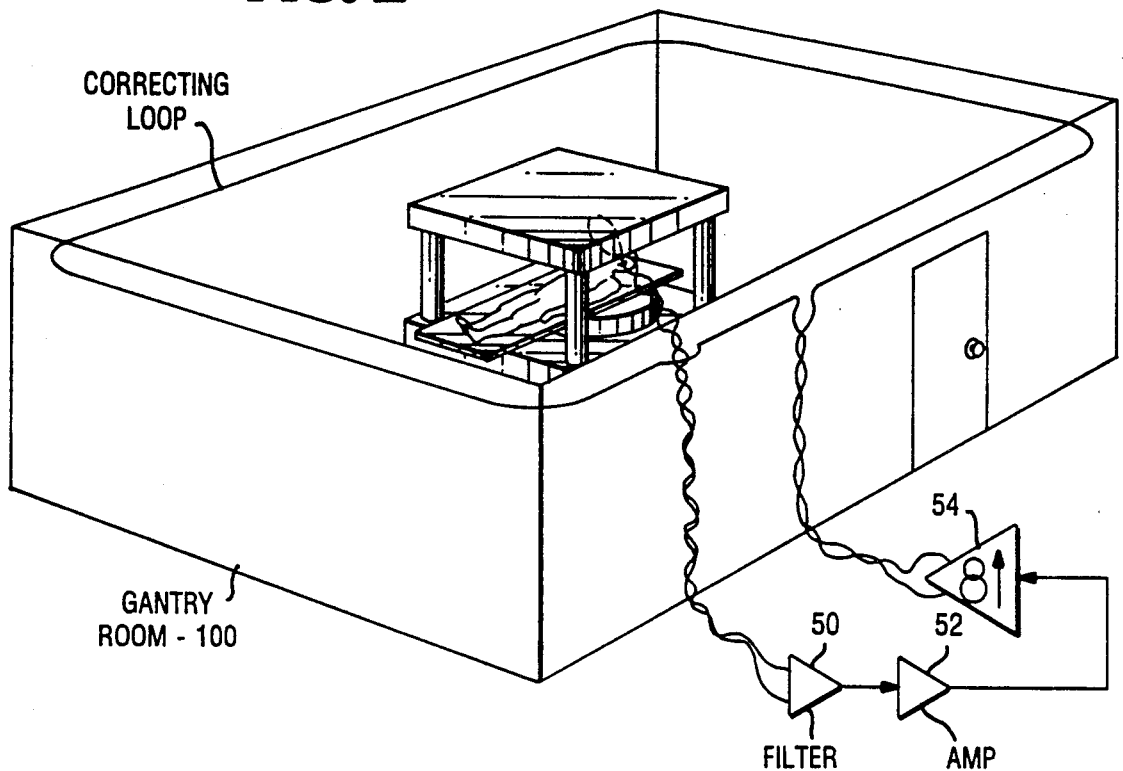
FIG. 2 is a further schematic depiction of the FIG. 1 embodiment better illustrating the preferred placement of the compensating loop.

FIG. 2 schematically depicts an exemplary gantry room 100 containing the MRI magnet to better schematically illustrate the preferred size and approximate location of compensating loop $L_3$. Here, the loop $L_3$ can be seen to encompass an area several times that occupied by the magnet. The connecting leads to/from the loops $L_1$, $L_2$, $L_3$ are also preferably twisted as depicted to better avoid 60 cycle or the like pickup (as should be understood by those in the art by analogy to twisted pair telephone lines and the like) As also depicted, the compensation loop $L_3$ is routed about the periphery of the screened gantry room 100. By thus making it relatively large compared to the magnet, the compensating field within the image volume is, at minimum cost, made more advantageously homogeneous. As will be understood, the filter 50, amplifier 52 and current source 54 may be located either within or without gantry room 100.

Figure 3:
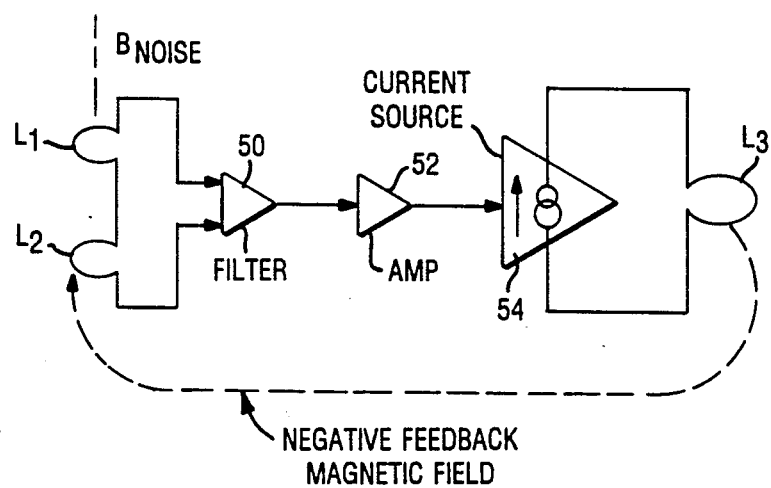
FIG. 3 is a schematic circuit diagram of novel circuit used in the exemplary embodiment of FIG. 1.

FIG. 3 schematically illustrates the magnetic noise cancelling circuitry portion of the invention—including a schematic depiction of the negative feedback magnetic field which may substantially cancel background magnetic noise $B_n$ over a frequency range of a few millihertz to as much as 100 Hz or more.

In the exemplary embodiment, typical relevant specifications for elements of a typical compensating system are:

1. Magnet size and diameter: 1.8 meters square
2. gantry room dimensions: 3 meters by 4 meters
3. compensating coils location and dimensions: 3 meters by 4 meters
4. sensing coil pairs location and dimensions: 1.5 meter diameter, on top and bottom of magnet
5. filter manufacturer, model and dimensions: Murate type 9001-100-1010 100 Hz Low Pass Filter
6. amplifier manufacturer, model and conventional OP AMP circuit dimensions:

7. current source manufacturers, model and dimensions: Techron No. 7540

Although only one exemplary embodiment of this invention has been described in detail, those skilled in the art will recognize that many variations and modifications may be made in such exemplary embodiment while yet retaining novel advantages and features of this invention. Accordingly, all such variations and modification are intended to be included within the scope of the appended claims.

What is claimed is:

1. In an MRI system having a main magnet for generating a background field $B_o$ along a central magnetic axis and a background magnetic field noise detector driving a negative feedback background magnetic field compensating coil, the improvement comprising:
said compensating coil being substantially larger than said main magnet to generate a spatially uniform correction field within an MRI volume.

2. An improved MRI system as in claim 1 wherein said noise detector comprises a pair of coils connected in series.

3. An improved MRI system as in claim 2 wherein said pair of coils are substantially centered about the central magnetic axis of said main magnet of the MRI system to minimize noise detector currents causes by gradient magnetic field variations in directions transverse to said axis.

4. An improved MRI system as in claim 3 wherein said MRI system includes at least one gradient magnetic field generator and wherein said par of coils are axially spaced apart symmetrically with respect to said gradient magnetic field generator of the MRI system.

5. An improved MRI system as in claim 1, 2, 3 or 4 wherein said noise detector is coupled to said compensating coil in an active negative feedback circuit having substantially zero gain at d.c. or zero frequency thereby making it insensitive to long term drifts in the background magnetic field.

6. An improved MRI system as in claim 1, 2, 3 or 4 further comprising programmed background field stability compensation means to attenuate the effects of noise variations in the background magnetic field over a frequency range from substantially zero Hz to about 1/TR, TR being maximum MRI cycle repetition interval.

7. An improved MRI system as in claim 5 further comprising programmed background field stability compensation means to attenuate the effects of noise variations in the background magnetic field over a frequency range from substantially zero Hz to about 1/TR, TR being the maximum MRI cycle repetition interval.

8. In an MRI system having a primary background magnetic field generator providing a background field $B_o$ along a central axis and a background magnetic field noise detector driving a negative feedback magnetic field compensating coil, the improvement comprising:
said noise detector including a pair of coils connected in series and encompassing the central axis of said primary background magnetic field generator of the MRI system.

9. An improved MRI system as in claim 8 wherein said pair of coils are substantially centered about the central magnetic axis of the primary background magnetic field generator of the MRI system.

10. An improved MRI system as in claim 9 wherein said MRI system includes at least one gradient magnetic field generator and wherein said coils are axially spaced apart symmetrically with respect to the gradient magnetic field generator of the MRI system.

11. An improved MRI system as in claim 8, 9 or 10 wherein said noise detector is coupled to said compensating coil in an active negative feedback circuit having substantially zero gain at d.c. or zero frequency thereby making it insensitive to long term drifts in the background magnetic field.

12. An improved MRI system as in claim 8, 9 or 10 further comprising programmed background field stability compensation means to attenuate the effects of noise variations in the background magnetic field over a frequency range from substantially zero Hz to about 1/TR, TR being the maximum MRI cycle repetition interval.

13. An improved MRI system as in claim 11 as further comprising programmed background field stability compensation means to attenuate the effects of noise variations in the background magnetic field over a frequency range from substantially zero Hz to about 1/TR, TR being the maximum MRI cycle repetition interval.

14. Apparatus for stabilizing the effective background magnetic field in an MRI system having a primary background magnetic field generator associated with an MRI volume, said apparatus comprising:
a magnetic field noise sensing coil means disposed to sense noise variations in the effective background magnetic field associated with the MRI volume;
a magnetic field correcting coil encompassing an area larger than the area occupied by a background magnetic field generator to generate a correcting field that is substantially uniform throughout the MRI volume when an electrical current is passed therethrough; and
an active negative feedback loop including a current source having a current control input coupled to said magnetic field noise sensing coil means and having a controlled current output coupled to said magnetic field correcting coil to produce a compensating background magnetic field that substantially cancels at least some components of the sensed noise variations in the background magnetic field.

15. Apparatus as in claim 14 wherein said primary background magnetic field generator is housed in a shielded gantry room and wherein said magnetic field correcting coil is disposed about the periphery of said gantry room so as to substantially encompass the gantry room.

16. Apparatus as in claim 14 wherein said magnetic field correcting coil encompasses an area that is at least twice as large as the area encompassed by said primary background magnetic field generator.

17. Apparatus as in claim 14 wherein said active negative feedback loop has substantially no gain at d.c. thereby making it insensitive to long term drifts in the background magnetic field.

18. Apparatus as in claim 14 wherein said MRI system includes field stability means for attenuating the effects of noise variations in the effective background magnetic field over a frequency range from substantially d.c. to about the reciprocal of a MRI cycle repetition interval TR.

19. In an MRI method using a main magnet for generating a background field $B_o$ along a central magnetic axis and using a background magnetic field noise detector driving a negative feedback background magnetic field compensating coil, the improvement comprising:
locating said compensating coil to encompass an area larger then said main magnet to generate a spatially uniform correction field within an MRI volume.

20. An improved MRI method as in claim 29 further comprising use of programmed background field stability compensation means to attenuate the effects of noise variations in the background magnetic field over a frequency range from substantially zero Hz to about 1/TR, TR being maximum MRI cycle repetition interval.

21. In an MRI method using a primary background field generator to provide a background field $B_o$ along a central axis and using a background magnetic field noise detector driving a negative feedback background magnetic field compensating coil, the improvement comprising:
connecting a pair of coils connected in series to constitute said noise detector which encompasses said primary background magnetic field generator of the MRI system.

22. An improved MRI method as in claim 21 wherein said pair of coils are substantially centered about the central magnetic axis of said primary background magnetic field generator of the MRI system.

23. An improved MRI method as in claim 22 wherein said MRI system includes at least one gradient magnetic field generator and wherein said coils are axially spaced apart symmetrically with respect to said gradient magnetic field generator of the MRI system.

24. An improved MRI method as in claim 21, 22 or 23 wherein said noise detector is coupled to said compensating coil in an active negative feedback circuit having substantially zero gain at d.c. or zero frequency thereby making it insensitive to long term drifts in the background magnetic field.

25. An improved MRI method as in claim 21, 22 or 23 further comprising use of programmed background field stability compensation means to attenuate the effects of noise variations in the background magnetic field over a frequency range from substantially zero Hz to about 1/TR, TR being the maximum MRI cycle repetition interval.

26. An improved MRI method as in claim 24 as further comprising use of programmed background field stability compensation means to attenuate the effects of noise variations in the background magnetic field over a frequency range from substantially zero Hz to about 1/TR, TR being the maximum MRI cycle repetition interval.

27. Method for stabilizing the effective background magnetic field in an MRI system having a primary background magnetic field generator associated with an MRI volume, said method comprising:
disposing magnetic field noise sensing coils to sense noise variations in the effective background magnetic field associated with the MRI volume;
disposing magnetic field correcting coil to encompass an area larger than the area occupied by said background magnetic field generator to generate a correcting field that is substantially uniform throughout the MRI volume when an electrical current is passed therethrough; and
driving an active negative feedback loop including a current source with said magnetic field noise sensing coils and producing a corresponding controlled current to said magnetic field correcting coil to generate a compensating background magnetic field that substantially cancels at least some components of the sensed noise variations in the background magnetic field.

28. Method as in claim 27 wherein said primary background magnetic field generator is housed in a shielded gantry room and further comprising disposing said magnetic field correcting coil about the periphery of said gantry room so as to substantially encompass the gantry room.

29. Method as in claim 27 wherein said magnetic field correcting coil encompasses an area that is at least twice as large as the area encompassed by said primary background magnetic field generator.

30. Method as in claim 27 wherein said active negative feedback loop has substantially no gain at d.c. thereby making it insensitive to long term drifts in the background magnetic field.

31. Method as in claim 27 including otherwise attenuating the effects of noise variations in the effective background magnetic field over a frequency range from substantially d.c. to about the reciprocal of a MRI cycle repetition interval TR.

* * * * *